(12) United States Patent
Ziegler, IV

(10) Patent No.: US 12,477,667 B2
(45) Date of Patent: Nov. 18, 2025

(54) BEZEL FILTER SATURATION LEVEL SENSING

(71) Applicant: Dell Products L.P., Round Rock, TX (US)

(72) Inventor: Charles W. Ziegler, IV, East Providence, RI (US)

(73) Assignee: Dell Products L.P., Round Rock, TX (US)

( * ) Notice: Subject to any disclaimer, the term of this patent is extended or adjusted under 35 U.S.C. 154(b) by 217 days.

(21) Appl. No.: 18/492,404

(22) Filed: Oct. 23, 2023

(65) Prior Publication Data

US 2025/0133669 A1    Apr. 24, 2025

(51) Int. Cl.
| | |
|---|---|
| G06F 1/16 | (2006.01) |
| B01D 46/00 | (2022.01) |
| B01D 46/44 | (2006.01) |
| H05K 5/00 | (2025.01) |
| H05K 5/02 | (2006.01) |
| H05K 7/00 | (2006.01) |

(52) U.S. Cl.
CPC ....... *H05K 5/0213* (2013.01); *B01D 46/0086* (2013.01); *B01D 46/446* (2013.01); *H05K 5/0243* (2013.01)

(58) Field of Classification Search
CPC .. H05K 5/0213; H05K 5/0214; H05K 5/0215; H05K 5/0216; H05K 5/0217; H05K 5/0243; H05K 7/1458; H05K 7/20181; H05K 7/20136; B01D 46/0086; B01D 46/446; B01D 46/0084; B01D 46/44
See application file for complete search history.

(56) References Cited

U.S. PATENT DOCUMENTS

| | | | | |
|---|---|---|---|---|
| 6,633,835 | B1 * | 10/2003 | Moran | H04L 47/745 |
| | | | | 702/182 |
| 7,665,071 | B1 * | 2/2010 | Roles | H04L 41/0233 |
| | | | | 717/124 |
| 9,644,856 | B1 * | 5/2017 | Francis | F24F 11/49 |
| 10,684,634 | B1 * | 6/2020 | Yang | G06F 1/28 |
| 12,265,830 | B2 * | 4/2025 | Wu | G06F 1/20 |
| 2003/0033362 | A1 * | 2/2003 | King | H04L 63/1416 |
| | | | | 709/203 |
| 2011/0185895 | A1 * | 8/2011 | Freen | F02M 35/09 |
| | | | | 95/25 |

(Continued)

*Primary Examiner* — Anthony M Haughton
(74) *Attorney, Agent, or Firm* — Larson Newman, LLP

(57) ABSTRACT

An information handling system includes a chassis, a filter, a force sensing resistor, and a baseboard management controller. The chassis includes a bezel. The filter is in physical communication with the bezel of the chassis. The force sensing resistor is in physical communication with the bezel and with the filter. The baseboard management controller communicates with the force sensing resistor and receives a voltage level from the force sensing resistor. Based on the voltage level, the baseboard management controller determines a clogged level for the filter. The baseboard management controller determines whether the clogged level is greater than a threshold level. In response to the clogged level being greater than the threshold level, the baseboard management controller determines that the filter needs to be replaced and provides a filter clogged message.

20 Claims, 5 Drawing Sheets

(56) References Cited

U.S. PATENT DOCUMENTS

| | | | | |
|---|---|---|---|---|
| 2014/0327630 A1* | 11/2014 | Burr | ................ | G09G 5/006 |
| | | | | 345/173 |
| 2015/0254958 A1* | 9/2015 | Sherman | ................ | F24F 11/52 |
| | | | | 340/607 |
| 2020/0012325 A1* | 1/2020 | Matsubara | ................ | G06F 1/20 |
| 2023/0228607 A1* | 7/2023 | Tunks | ................ | G08B 21/182 |
| | | | | 702/100 |
| 2023/0337392 A1* | 10/2023 | Tunks | ................ | H05K 7/20718 |
| 2024/0023273 A1* | 1/2024 | Tunks | ................ | H05K 7/20836 |

* cited by examiner

BEZEL FILTER SATURATION LEVEL SENSING

FIELD OF THE DISCLOSURE

The present disclosure generally relates to information handling systems, and more particularly relates to sensing a bezel filter saturation level via a force sensing resistor.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a chassis, a filter, a force sensing resistor, and a baseboard management controller. The chassis includes a bezel. The filter is in physical communication with the bezel of the chassis. The force sensing resistor is in physical communication with the bezel and with the filter. The baseboard management controller may communicate with the force sensing resistor and receive a voltage level from the force sensing resistor. Based on the voltage level, the baseboard management controller may determine a clogged level for the filter. The baseboard management controller may determine whether the clogged level is greater than a threshold level. In response to the clogged level being greater than the threshold level, the baseboard management controller may determine that the filter needs to be replaced and provide a filter clogged message.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
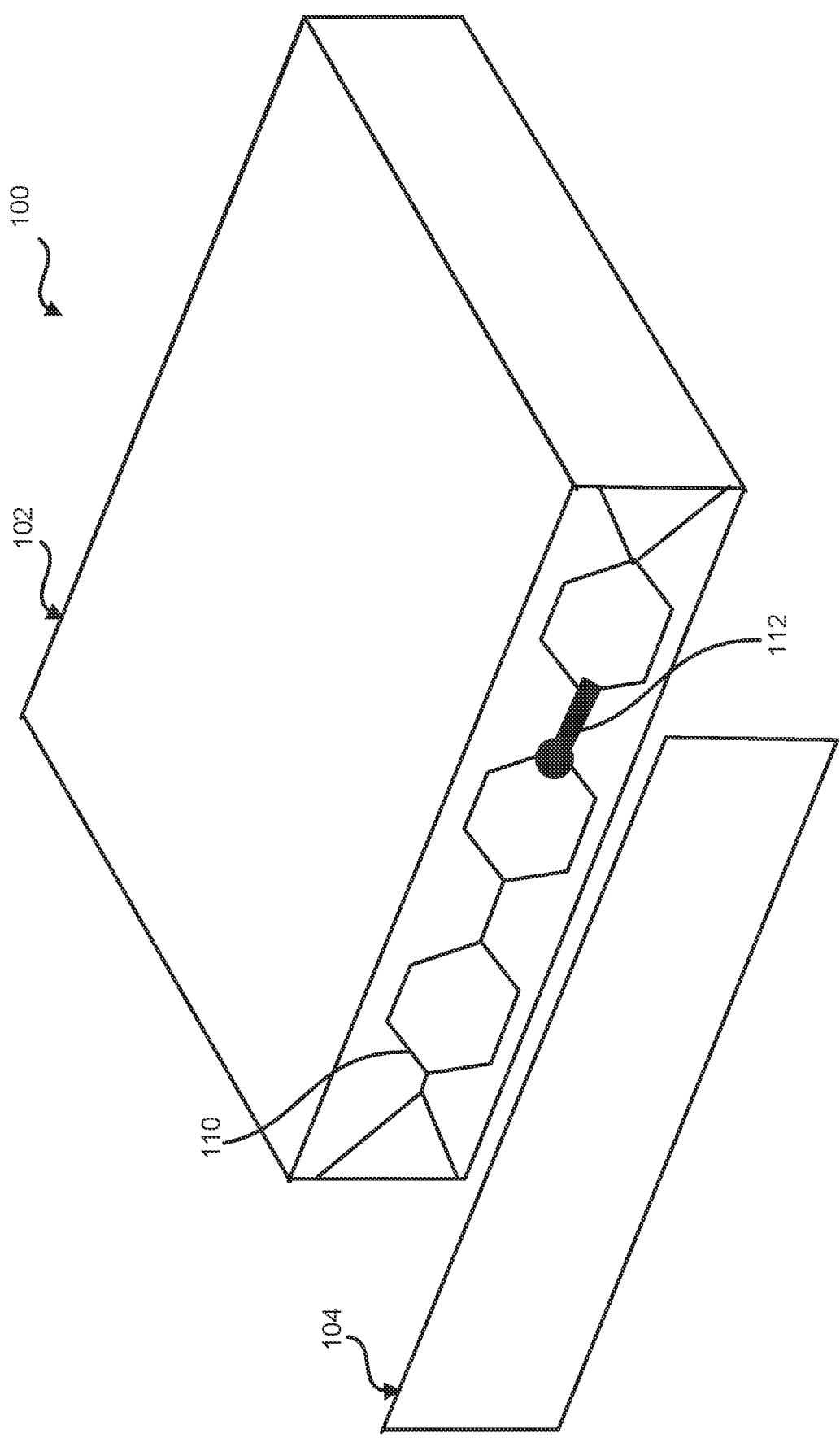
FIG. 1 is a diagram of a portion of a system including an information handling system according to at least one embodiment of the present disclosure.

FIG. 1 illustrates a portion of an information handling system 100 according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Information handling system 102 includes a chassis 102, a filter 104, and a force sensing resistor (FSR) 106. Chassis 102 includes a main portion 110 and a bezel 112 located within a front edge of the main portion. FSR 106 may be physically mounted to bezel 112 of chassis 102. Information handling system 100 may include additional components without varying from the scope of this disclosure.

In an example, when filter 104 is snap fitted within the front edge of main portion 110, FSR 106 may be located between and in physical communication with both the filter and bezel 112. While FSR 106 is located between filter 104 and bezel 112, the FSR may sense or detect a level of force caused by an accumulation of particles or substances within the filter. As particles or substances buildup on filter 104 and an airflow continues through the filter into chassis 102, the airflow may exert a force on the filter because the airflow through the filter is restricted by the buildup. This force exerted by the airflow may be measured by FSR 106 and provided as a voltage to a component within information handling system 100, such as baseboard management controller (BMC) 310 FIG. 3.

In certain examples, the resistance of FSR 106 may be calibrated to correspond to different saturation levels over different operating temperatures of information handling system 100. The calibration may allow BMC 310 of FIG. 3 to monitor the performance of filter 104. In an example, FSR 106 may provide a direct measurement of the physical force against the surface of filter 104. The force on FSR 106 may cause the FSR to generate a voltage, which in turn may be provided to BMC 310 of FIG. 3 to determine the level of particle saturation on filter 104.

Figure 2:
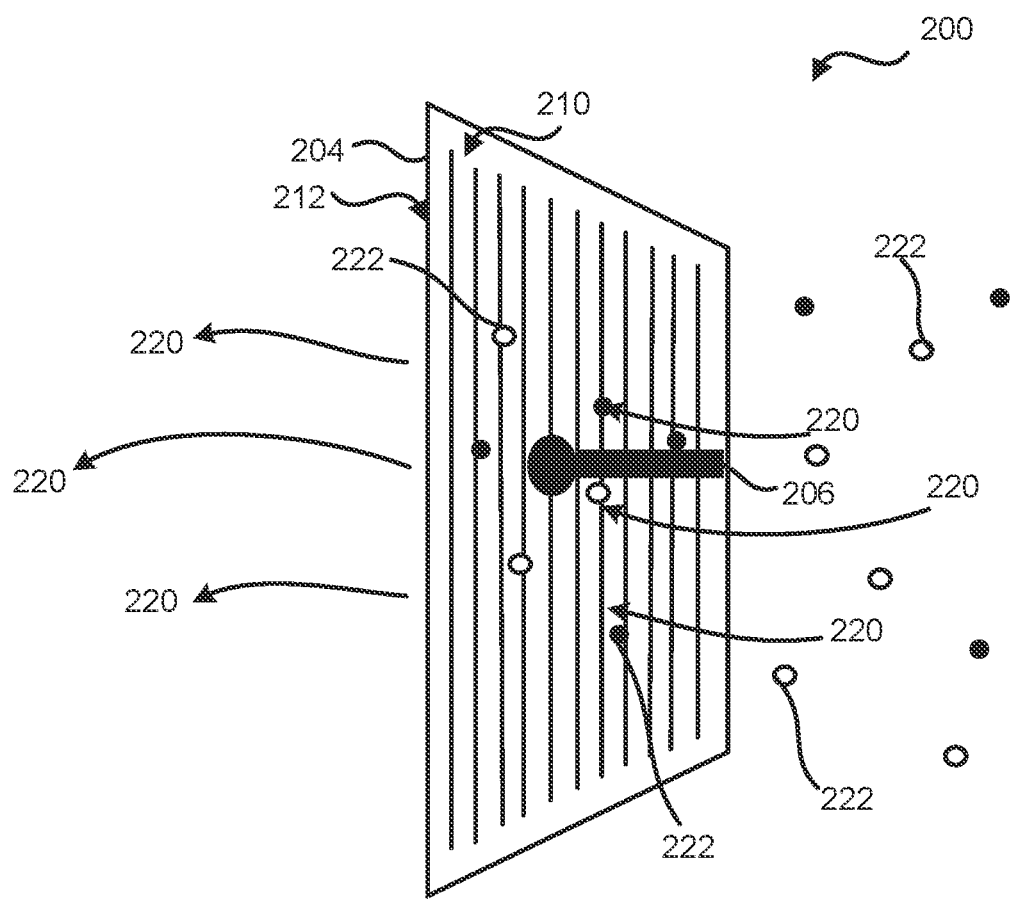
FIG. 2 is a diagram of a filter and a force sensing resistor according to at least one embodiment of the present disclosure.

FIG. 2 illustrates a filter 204 and a FSR 206 according to at least one embodiment of the present disclosure. Filter 204 may be substantially similar to filter 104 of FIG. 1, and FSR 206 may be substantially similar to FSR 106 of FIG. FIG. 1. Filter 204 includes an outer surface 210 and an inner surface 212. FSR 212 may be placed in physical communication with inner surface 212 of filter 204.

As an airflow 220 moves through filter 204 particles or substances 222 may accumulate on outer surface 210. In an example, as particles/substances 222 accumulate on outer surface 210, the accumulation may increase a clogged level of filter 204 and restrict airflow 220 through the filter. As accumulation of particles/substances 222 increases, the restriction of airflow 220 also increases. This increase in the restriction of airflow 220 may cause the airflow to push against filter 204 in the areas of accumulation. In an example, the force of airflow 220 may cause filter 204 to push against FSR 206. This force against FSR 206 may cause the FSR to output a voltage corresponding to a level of the force exerted on the FSR. The voltage may be provided to BMC 310, which in turn may perform one or more operations to determine an accumulation or clogged level as will be described with respect to FIG. 3.

Figure 3:
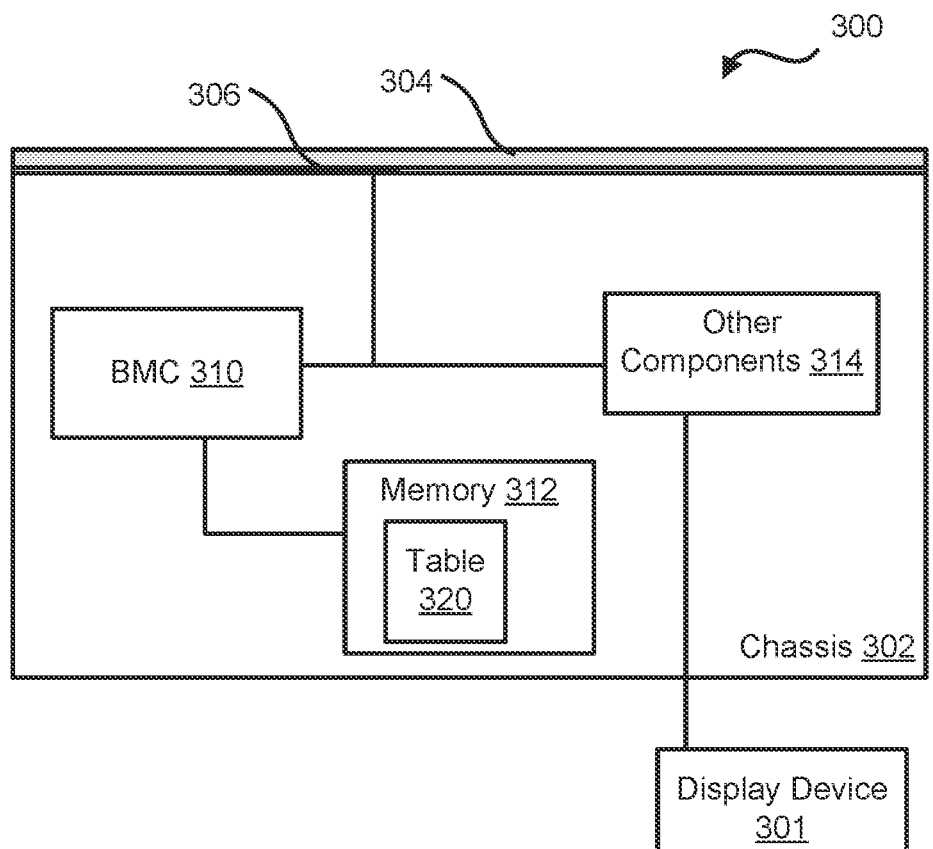
FIG. 3 is a diagram of a portion of an information handling system according to at least one embodiment of the present disclosure.

FIG. 3 illustrates a portion of an information handling system 300 and a display device 301 according to at least one embodiment of the present disclosure. Information handling system 300 may be substantially similar to information handling system 100 of FIG. 1. Information handling system 300 includes a chassis 302, a filter 304, and a FSR 306. Filter 302 may be substantially similar to filter 104 of FIG. 1 and filter 204 of FIG. 2. FSR 306 may be substantially similar to FSR 112 of FIG. 1 and FSR 206 of FIG. 2. Information handling system 300 further includes BMC 310, a memory 312, and other components 314. FSR 306 is in physical communication with and located in between filter 304 and front of chassis 302. FSR 306 is in communication with BMC 310, which in turn is in communication with memory 312. Information handling system 300 may include any additional components without varying from the scope of this disclosure.

In an example, FSR 306 may be calibrated in such a manner that a particular resistance of the FSR corresponds to a particular force exerted on the FSR from filter 304. In certain examples, FSR 306 may have any suitable level of output voltage resolution, such as a millivolt range. During calibration of FSR 306, BMC 310 may receive a voltage from the FSR and may correlate the voltage with a clean filter 304. BMC 310 may create a table 320 in memory 312 correlating different voltages from FSR 306 to different levels of accumulation of particles or substances on filter 304. In certain examples, BMC 310 may receive data for the correlation of different voltages to different levels of accumulation or clogged of filter 304 from any suitable source. For example, the data may be predetermined and stored in table 320 or the data may be collected or determined based on a set of measurements during a calibration of FSR. In this examples, the voltages and corresponding accumulations or clogged levels of filter 304 may be stored in table 320.

During operation of information handling system 300, an airflow, such as airflow 220 of FIG. 2, may be pulled through filter 304 and into chassis 302 to cool BMC 310, memory 312, and other components 314. As the airflow is pulled through filter 304, dust particles and other substances may float on the airflow and attach to the filter as the airflow continues within chassis 302. Over time, the amount of dust particles and other substances may build up on filter 304 and restrict the airflow from entering chassis 302. In an example, as the accumulation of particles/substances increases, the restriction of the airflow also increases. This increase in the restriction of the airflow may cause a force to be exerted on filter 304 in the areas of the accumulation.

In certain examples, the force of the airflow on filter 304 may be transferred to FSR 306, which in turn may change its internal resistance based on the level of the force. In an example, the change in the internal resistance of FSR 306 may create a different voltage to be applied to or received by BMC 310. Based on the received voltage, BMC 310 may determine a percentage of accumulation or a clogged level of filter 304. For example, BMC 310 may retrieve the percentage of accumulation or the clogged level of filter 304 corresponding to the particular voltage from table 320. In certain examples, table 320 may include multiple entries and each entry may correlate a different voltage level to a different accumulation or clogged level. In an example, BMC 310 may determine whether the voltage from FSR 306 is over a threshold level. If the voltage is over the threshold level, BMC 310 may determine that level of accumulation is above a threshold level and filter 304 is clogged. In certain examples, the threshold level may be stored in table 320 and BMC 310 may access the table in memory 312 to determine whether filter 304 is clogged.

Based on the determined percentage of accumulation, the clogged level of filter 304, or that the level of accumulation is above a threshold level, BMC 310 may provide one or more notifications to an individual associated with information handling system 300. For example, BMC 310 may provide a filter clogged message on display device 301 via a display controller in other components 314. In certain examples, BMC 310 may provide different messages based on the level of accumulation. For example, one message may indicate a percentage that filter 304 is clogged, another message may indicate that the filter is clogged and needs to be cleaned/replaced, another message may indicate that airflow may be critically low within chassis 302, or the like.

Figure 4:
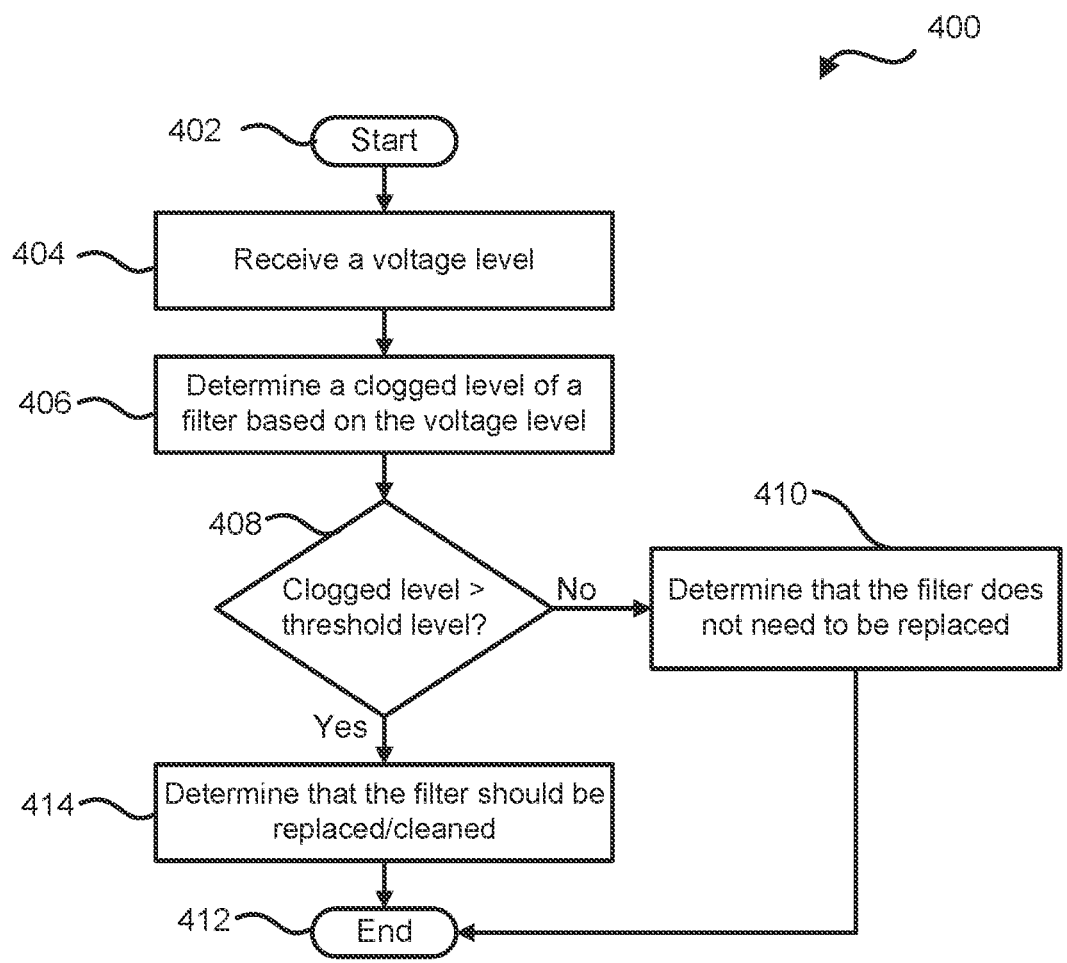
FIG. 4 is a flow diagram of a method for providing a uniform video appearance during a video recording according to at least one embodiment of the present disclosure.

FIG. 4 is a flow diagram of a method 400 for providing a uniform video appearance during a video recording according to at least one embodiment of the present disclosure, starting at block 402. In an example, method 400 may be performed by any suitable component including, but not limited to, BMC 310 of FIG. 3. It will be readily appreciated that not every method step set forth in this flow diagram is always necessary, and that certain steps of the methods may be combined, performed simultaneously, in a different order, or perhaps omitted, without varying from the scope of the disclosure.

At block 404, a voltage level is received. In an example, a BMC of an information handling system may receive the voltage level from a FSR within the information handling system. In certain examples, the voltage level may be generated based on a change of resistance within the FSR. The change of resistance may be based on a force exerted against the FSR. In an example, the force may be created by an airflow pushing a filter toward the FSR based on an accumulation of dust particles or other substances on the filter.

At block 406, a clogged level is determined based on the voltage level. In an example, the clogged level may be determined based on any suitable data. For example, a BMC may determine a clogged level located within a table that corresponds to the receive voltage level. In certain examples, the table may include any suitable number of entries that correspond different voltage levels to different clogged levels. In an example, the table may include data identifying a threshold clogged level for the filter.

At block 408, a determination is made whether the clogged level is greater than the threshold level. In an example, the threshold level may be any suitable amount of accumulation of particles and substances, and when the accumulation exceeds this threshold an amount of airflow within the information handling system may be reduced to an amount that is insufficient to cool the components of the information handling system.

If the clogged level is not greater than the threshold level, a determination is made that a filter does not need to be replaced at block 410 and the flow ends at block 412. If the clogged level is greater than the threshold level, a determination is made that a filter does not need to be replaced at block 414 and the flow ends at block 412.

Figure 5:
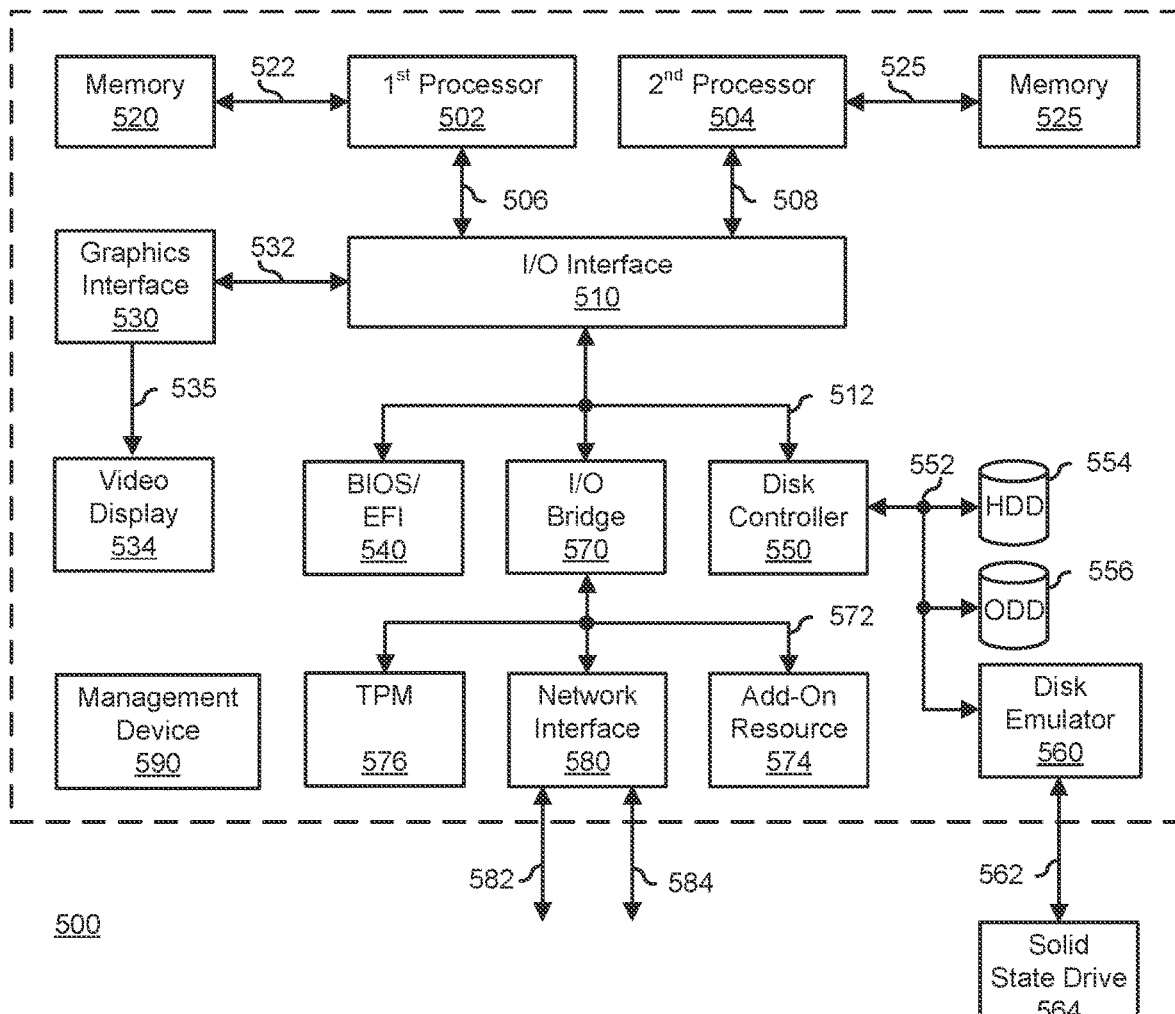
FIG. 5 is a block diagram of a general information handling system according to an embodiment of the present disclosure.

FIG. 5 shows a generalized embodiment of an information handling system 500 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), an embedded device such as a System-on-a-Chip (SoC), or other control logic hardware. Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described below and operates to perform one or more of the methods described below. Information handling system 500 includes a processors 502 and 504, an input/output (I/O) interface 510, memories 520 and 525, a graphics interface 530, a basic input and output system/universal extensible firmware interface (BIOS/UEFI) module 540, a disk controller 550, a hard disk drive (HDD) 554, an optical disk drive (ODD) 556, a disk emulator 560 connected to an external solid state drive (SSD) 562, an I/O bridge 570, one or more add-on resources 574, a trusted platform module (TPM) 576, a network interface 580, a management device 590, and a power supply 595. Processors 502 and 504, I/O interface 510, memory 520, graphics interface 530, BIOS/UEFI module 540, disk controller 550, HDD 554, ODD 556, disk emulator 560, SSD 562, 1/O bridge 570, add-on resources 574, TPM 576, and network interface 580 operate together to provide a host environment of information handling system 500 that operates to provide the data processing functionality of the information handling system. The host environment operates to execute machine-executable code, including platform BIOS/UEFI code, device firmware, operating system code, applications, programs, and the like, to perform the data processing tasks associated with information handling system 500.

In the host environment, processor 502 is connected to I/O interface 510 via processor interface 506, and processor 504 is connected to the I/O interface via processor interface 508. Memory 520 is connected to processor 502 via a memory interface 522. Memory 525 is connected to processor 504 via a memory interface 527. Graphics interface 530 is connected to I/O interface 510 via a graphics interface 532 and provides a video display output 536 to a video display 534. In a particular embodiment, information handling system 500 includes separate memories that are dedicated to each of processors 502 and 504 via separate memory interfaces. An example of memories 520 and 530 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 540, disk controller 550, and I/O bridge 570 are connected to I/O interface 510 via an I/O channel 512. An example of I/O channel 512 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 510 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 540 includes BIOS/UEFI code operable to detect resources within information handling system 500, to provide drivers for the resources, initialize the resources, and access the resources. BIOS/UEFI module 540 includes code that operates to detect resources within information handling system 500, to provide drivers for the resources, to initialize the resources, and to access the resources.

Disk controller 550 includes a disk interface 552 that connects the disk controller to HDD 554, to ODD 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an IEEE 4394 (Firewire) interface, a proprietary interface, or a combination thereof. Alternatively, solid-state drive 564 can be disposed within information handling system 500.

I/O bridge 570 includes a peripheral interface 572 that connects the I/O bridge to add-on resource 574, to TPM 576, and to network interface 580. Peripheral interface 572 can be the same type of interface as I/O channel 512 or can be a different type of interface. As such, I/O bridge 570 extends the capacity of I/O channel 512 when peripheral interface 572 and the I/O channel are of the same type, and the I/O bridge translates information from a format suitable to the I/O channel to a format suitable to the peripheral channel 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as I/O interface 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Management device 590 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 500. In particular, management device 590 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 500, such as system cooling fans and power supplies. Management device 590 can include a network connection to an external management system, and the management device can communicate with the management system to report status information for information handling system 500, to receive BIOS/UEFI or system firmware updates, or to perform other task for managing and controlling the operation of information handling system 500.

Management device 590 can operate off of a separate power plane from the components of the host environment so that the management device receives power to manage information handling system 500 when the information handling system is otherwise shut down. An example of management device 590 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 590 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
a chassis including a bezel;
a filter in physical communication with the bezel of the chassis;
a force sensing resistor in physical communication with the bezel and with the filter; and
a baseboard management controller to communicate with the force sensing resistor, the baseboard management controller to:
receive a voltage level from the force sensing resistor;
based on the voltage level, determine a clogged level for the filter;
determine whether the clogged level is greater than a threshold level; and
in response to the clogged level being greater than the threshold level:
determine that the filter needs to be replaced; and
provide a filter clogged message.

2. The information handling system of claim 1, further comprising: a display device to receive the filter clogged message, and output the filter clogged message.

3. The information handling system of claim 1, further comprising: a memory to store a table, wherein the table includes multiple entries and each of the multiple entries correlates a different voltage level to a different clogged level.

4. The information handling system of claim 1, wherein in response to the clogged level being less than the threshold level, the baseboard management controller further to: provide a filter clogged percentage message.

5. The information handling system of claim 1, wherein the force sensing resistor provides the voltage level based on a force exerted on the force sensing resistor from the filter.

6. The information handling system of claim 5, wherein the force exerted on the force sensing resistor is based on a second force exerted on the filter from an airflow through the filter.

7. The information handling system of claim 5, wherein the force exerted on the force sensing resistor increases as the clogged level increases.

8. The information handling system of claim 1, wherein an amount of airflow through the filter decreases and the clogged level increases.

9. A method comprising:
receiving, by a baseboard management controller of an information handling system, a voltage level from the force sensing resistor;
based on the voltage level, determining a clogged level for the filter;
determining whether the clogged level is greater than a threshold level; and
in response to the clogged level being greater than the threshold level:
determining that the filter needs to be replaced; and
providing a filter clogged message.

10. The method of claim 9, further comprising:
receiving, by a display device of the information handling system, the filter clogged message from the baseboard management controller; and
outputting, by the display device, the filter clogged message.

11. The method of claim 9, further comprising: storing a table in a memory of the information handling system, wherein the table includes multiple entries and each of the multiple entries correlates a different voltage level to a different clogged level.

12. The method of claim 9, wherein in response to the clogged level being less than the threshold level, the method further to: providing a filter clogged percentage message.

13. The method of claim 9, wherein the force sensing resistor provides the voltage level based on a force exerted on the force sensing resistor from the filter.

14. The method of claim 13, wherein the force exerted on the force sensing resistor is based on a second force exerted on the filter from an airflow through the filter.

15. The method of claim 13, wherein the force exerted on the force sensing resistor increases as the clogged level increases.

16. The method of claim 9, wherein an amount of airflow through the filter decreases and the clogged level increases.

17. An information handling system comprising:
a chassis including a bezel;
a filter in physical communication with the bezel;
a memory to store a table, wherein the table includes multiple entries and each of the multiple entries correlates a different voltage level to a different level of clogging of the filter;
a force sensing resistor in physical communication with the bezel and with the filter;
a baseboard management controller to:
based on a voltage level from the force sensing resistor, determine the level of clogging of the filter;
if the level is greater than a threshold level, then determine that the filter needs to be replaced and provide a filter clogged message; and
a display device to display the filter clogged message.

18. The information handling system of claim 17, wherein the force sensing resistor provides the voltage level based on a force exerted on the force sensing resistor from the filter.

19. The information handling system of claim 18, wherein the force exerted on the force sensing resistor increases as the clogged level increases.

20. The information handling system of claim 17, wherein an amount of airflow through the filter decreases and the clogged level increases.

* * * * *